United States Patent
Hwangbo et al.

(10) Patent No.: US 9,935,142 B2
(45) Date of Patent: Apr. 3, 2018

(54) IMAGE SENSOR INCLUDING TRANSFER GATES IN DEEP TRENCHES

(71) Applicant: SK hynix Inc., Gyeonggi-do (KR)

(72) Inventors: Kwang Hwangbo, Gyeonggi-do (KR); Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/441,437

(22) Filed: Feb. 24, 2017

(65) Prior Publication Data

US 2017/0373108 A1 Dec. 28, 2017

(30) Foreign Application Priority Data

Jun. 24, 2016 (KR) .................. 10-2016-0079252

(51) Int. Cl.
*H01L 27/148* (2006.01)
*H01L 27/146* (2006.01)
*H04N 5/378* (2011.01)

(52) U.S. Cl.
CPC .... *H01L 27/14614* (2013.01); *H01L 27/1463* (2013.01); *H01L 27/1464* (2013.01); *H01L 27/14621* (2013.01); *H01L 27/14627* (2013.01); *H01L 27/14645* (2013.01); *H01L 27/14689* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 7,518,172 B2 | 4/2009 | Moon et al. | |
| 9,245,921 B2 * | 1/2016 | Yamamoto | ........ H01L 27/14887 |
| 2005/0090074 A1 | 4/2005 | Mouli et al. | |
| 2011/0084322 A1 | 4/2011 | Kang | |
| 2011/0181749 A1 * | 7/2011 | Yamada | .............. H01L 27/1461 |
| | | | 348/222.1 |
| 2014/0077323 A1 | 3/2014 | Velichko et al. | |
| 2015/0236058 A1 | 8/2015 | Hu et al. | |
| 2016/0218138 A1 * | 7/2016 | Oishi | ............... H01L 27/14643 |

FOREIGN PATENT DOCUMENTS

| | | |
|---|---|---|
| KR | 1020140006370 | 1/2014 |
| KR | 1020150099119 | 8/2015 |
| KR | 1020160008922 | 1/2016 |

* cited by examiner

*Primary Examiner* — Ali Naraghi
(74) *Attorney, Agent, or Firm* — IP & T Group LLP

(57) ABSTRACT

An image sensor is described. The image sensor includes a photodiode that is formed in a substrate, a floating diffusion region that vertically overlaps with a first portion of the photodiode, a shallow trench isolation (STI) region that vertically overlaps with a second portion of the photodiode and has an elbow shape, and a transfer gate that is adjacent to at least two sides of the photodiode and has an elbow shape.

14 Claims, 22 Drawing Sheets

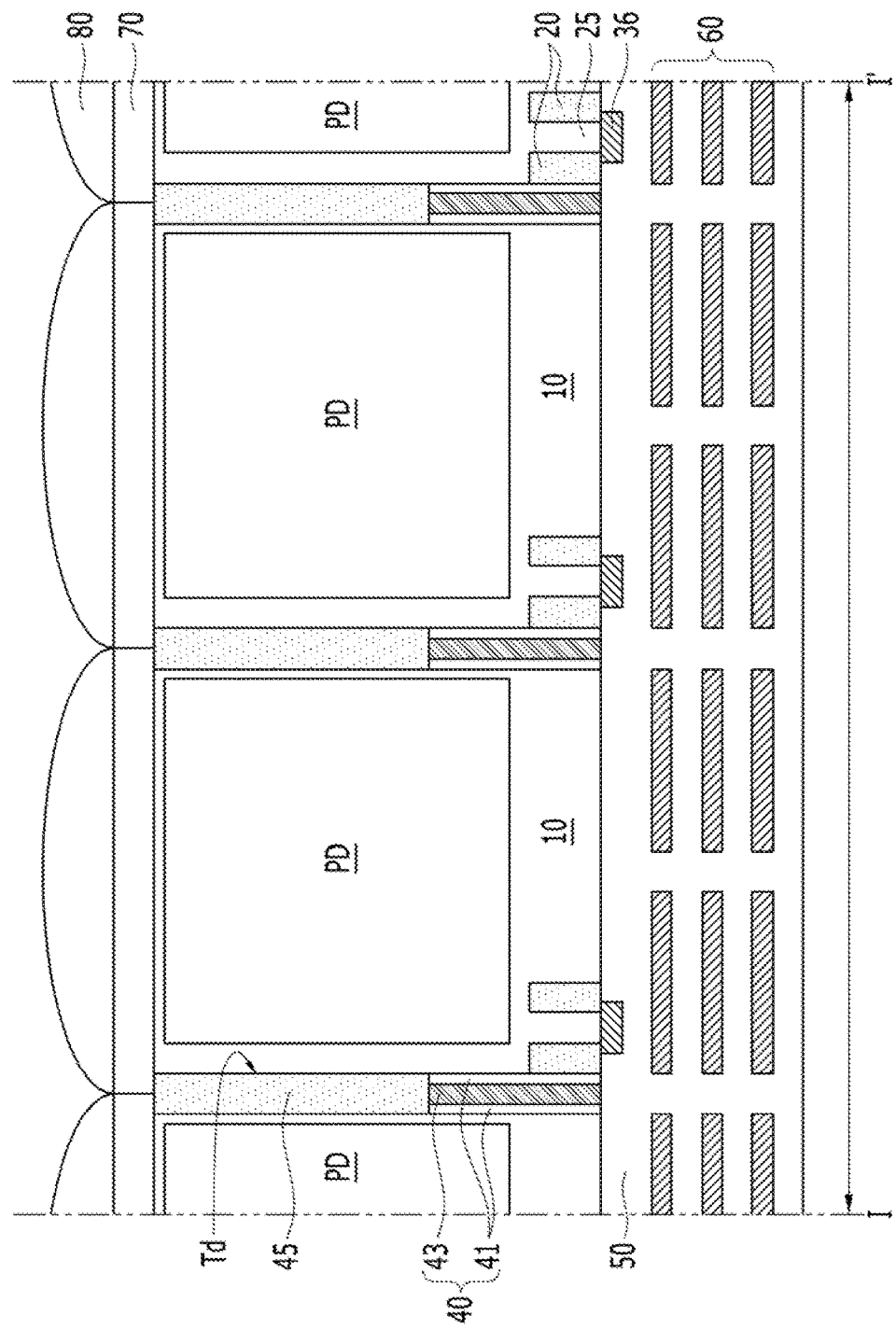

IMAGE SENSOR INCLUDING TRANSFER GATES IN DEEP TRENCHES

CROSS-REFERENCE TO RELATED APPLICATIONS

The present application claims priority of Korean Patent Application No. 10-2016-0079252, filed on Jun. 24, 2016, which is incorporated herein by reference in its entirety.

BACKGROUND

1. Field

Exemplary embodiments of the present invention relate to an image sensor including transfer gates in deep trenches.

2. Description of the Related Art

An image sensor is a device that converts an optical image into electrical signals. Recent advancements in the computer industry and communication industries demand image sensors with higher integration degree and improved performance in diverse applications such as digital cameras, camcorders, personal communication systems (PCS), game players, security surveillance cameras, medical micro cameras, robots and the like. Nowadays, auto-focusing technology by detecting a phase difference of light is in the spotlight.

SUMMARY

Embodiments of the present invention are directed to an image sensor including transfer gates in the inside of deep trenches.

Embodiments of the present invention are directed to an image sensor including vertical transfer channels.

Besides the objectives of the embodiments of the present invention described above, there may be other diverse objectives of the embodiments of the present invention, which may be obvious to and understood by those skilled in the art to which the inventive concept of the present invention pertains from the following description.

In accordance with an embodiment of the present invention, an image sensor includes a photodiode formed in a substrate, a floating diffusion region that vertically overlaps with a first portion of the photodiode, a shallow trench isolation (STI) region that vertically overlaps with a second portion of the photodiode and has an elbow shape; and a transfer gate that is adjacent to at least two sides of the photodiode and has an elbow shape.

The floating diffusion region may be disposed over one of corners of the photodiode.

The STI region may vertically overlap with a first region adjacent to a first side of the photodiode and a second region adjacent to a second side of the photodiode.

The transfer gate may be disposed adjacent to a third side and a fourth side of the photodiode.

The transfer gate may not vertically overlap with the photodiode.

The transfer gate may include: a transfer gate insulating layer that is conformally formed on internal walls of a trench; and a gate electrode that is formed over the transfer gate insulating layer to fill the trench.

The image sensor may further include a horizontal active region and a vertical active region. The STI region may include: a horizontal portion that defines the horizontal active region; and a vertical portion that defines the vertical active region.

The image sensor may further include a first horizontal gate electrode and a second horizontal gate electrode that are disposed over the horizontal active region; and a vertical gate electrode that is disposed over the vertical active region.

In accordance with another embodiment of the present invention, an image sensor includes: a first photodiode and a second photodiode that are formed adjacent to each other in a substrate; a transfer gate that is disposed between the first photodiode and the second photodiode; a floating diffusion region that is adjacent to a first side of the transfer gate and vertically overlaps with a portion of the first photodiode; and a shallow trench isolation (STI) region that is adjacent to a second side of the transfer gate and vertically overlaps with a portion of the second photodiode.

The image sensor may further include an active region. The STI region may define the active region that vertically overlaps with the portion of the second photodiode.

The image sensor may further include: a pixel gate electrode that is disposed over the active region and vertically overlaps with the portion of the second photodiode.

The transfer gate may include: a trench that has a longer depth than heights of the first photodiode and the second photodiode; a transfer gate insulating layer that is conformally formed on side walls of the trench; and a transfer gate electrode that is formed over the transfer gate insulating layer to fill the trench.

The trench vertically may pass through the substrate completely.

The transfer gate may further include a gap-fill insulator that fills a portion of the trench.

A first distance between the transfer gate and the first photodiode may be shorter than a second distance between the transfer gate and the second photodiode.

In accordance with yet another embodiment of the present invention, an image sensor includes: a plurality of unit pixels that are arranged in a matrix form, wherein each of the plurality of the unit pixels includes a photodiode that substantially has a square shape in a top view; a shallow trench isolation (STI) region that vertically overlaps with a first portion of the photodiode adjacent to an upper side and a left side of the photodiode; a trench that surrounds an external side of the photodiode to be adjacent to a lower side and a right side of the photodiode; a transfer gate that is formed in the trench; and a floating diffusion region that is disposed adjacent to the transfer gate and vertically overlaps with a portion of the photodiode.

The STI region and the transfer gate may have an elbow shape in a top view, respectively.

The STI region and the transfer gate may form square shape together in a top view.

The image sensor may further include an active region that vertically overlaps with a portion of the first portion of the photodiode. The STI region may define an active region.

The image sensor may further include: a pixel gate electrode that vertically overlaps with the active region. The pixel gate electrode provides at least one among a drive gate electrode, a select gate electrode, and a reset gate electrode.

BRIEF DESCRIPTION OF THE DRAWINGS

FIGS. 5A and 5B are longitudinal cross-sectional views illustrating the pixels of the image sensor in accordance with the embodiment of the present invention.

DETAILED DESCRIPTION

Figure 1:
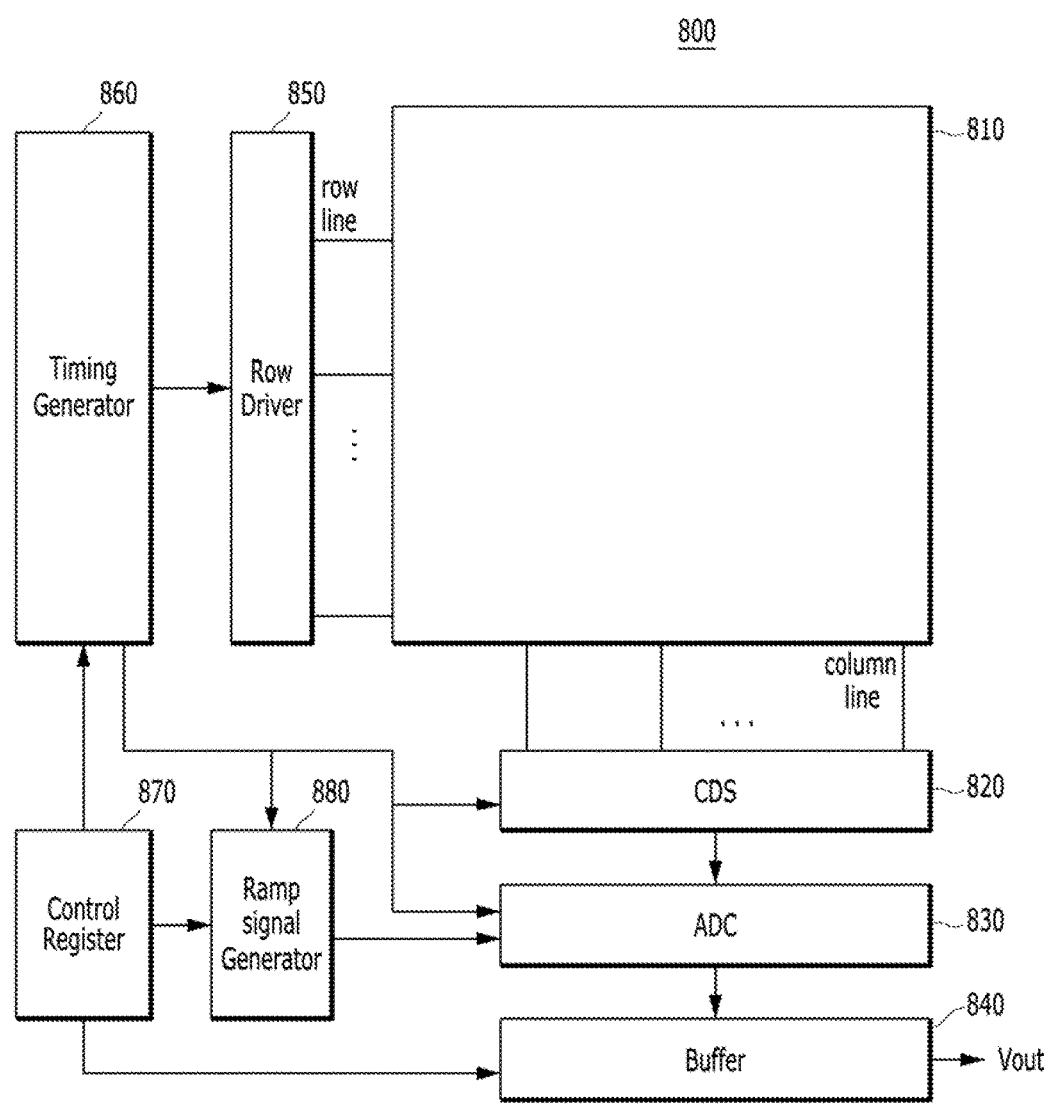
FIG. 1 is a block diagram illustrating an image sensor in accordance with an embodiment of the present invention.

Exemplary embodiments of the present invention will be described below in more detail with reference to the accompanying drawings. The inventive concept of the present invention may, however, be embodied in different forms and should not be construed as limited to the embodiments set forth herein. Rather, these embodiments are provided to make this disclosure thorough and complete, and fully convey the scope of the present invention to those skilled in the art. The spirit and scope of the invention are as defined in the claims.

The terms used in this patent specification are for describing the embodiments of the present invention and they do not limit the scope of the present invention. In this specification, the use of a singular term includes a plural term as well unless specifically mentioned otherwise. The use of an expression 'includes,' 'including,' 'comprises,' and/or 'comprising' a constituent element in this patent specification does not exclude the presence or addition of another constituent element.

When an element is described in this specification to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case where the first layer is formed directly on the second layer or the substrate but also a case where a third layer exists between the first layer and the second layer or the substrate.

The terms 'below' 'beneath', 'lower' 'above', and 'upper' are spatially relative words, and they may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the present invention described in this specification are described with reference to the exemplary drawings which are cross-sectional views and/or plan views. The drawings are not necessarily to scale and in some instances, proportions may have been exaggerated in order to clearly illustrate features of the embodiments. Therefore, the forms of the exemplary drawings may be changed due to a fabrication method and/or tolerance. In this respect, the embodiments of the present invention are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily illustrated in the drawings just show specific shapes of the regions of an element and they do not limit the scope of the present invention.

Throughout the disclosure, like reference numerals refer to like parts throughout the various figures and embodiments of the present invention. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

FIG. 1 is a block diagram illustrating an image sensor 800 in accordance with an embodiment of the present invention. Referring to FIG. 1, the image sensor 800 may include a pixel array 810 where a plurality of pixels are arranged in a matrix structure, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels that are arranged in a matrix structure of a plurality of rows and columns. The pixels may convert optical image data into electrical image signals and transfer the electrical image signals to the correlated double sampler 820 through column lines. Each of the pixels may be coupled to one row line among a plurality of row lines and one column line among a plurality of column lines. The matrix structure may be a two-dimensional or a three-dimensional structure.

The correlated double sampler 820 may hold and sample the electrical image signals that are received from the pixels of the pixel array 810. For example, the correlated double sampler 820 may sample the voltage of a received electrical image signal from a pixel when the pixel is subjected to incident light, and compare the sampled voltage with a reference voltage. The reference voltage may be measured from a received electrical signal form the pixel when the pixel is not subjected to incident light. The correlated double sampler 820 may receive a clock signal that is supplied by the timing generator 860. The correlated double sampler 820 may also transfer an analog signal corresponding to the measured voltage difference between the two voltages to the analog-to-digital converter 830.

The analog-to-digital converter 830 may convert the received analog signal into digital signals and transfer the digital signals to the buffer 840.

The buffer 840 then may latch the received digital signals, and sequentially output the latched digital signals Vout to an image signal processor (not shown). The buffer 840 may include a memory for latching the digital signals and a sense amplifier for amplifying the digital signals.

The row driver 850 may drive one or more pixels of the pixel array 810 based on a signal of the timing generator 860. For example, the row driver 850 may generate a selection signal for selecting one row line among the plurality of row lines. The row driver 850 may generate a driving signal for driving the selected row line.

The timing generator 860 may generate timing signals for controlling the operation of correlated double sampler 820, the analog-to-digital converter 830, the row driver 850, and the ramp signal generator 880.

The control register 870 may generate control signals for controlling the buffer 840, the timing generator 860, and the ramp signal generator 880.

The ramp signal generator 880 may generate a ramp signal for controlling the image signal outputted to the ADC 830 under the control of the timing generator 860.

Figure 2A:
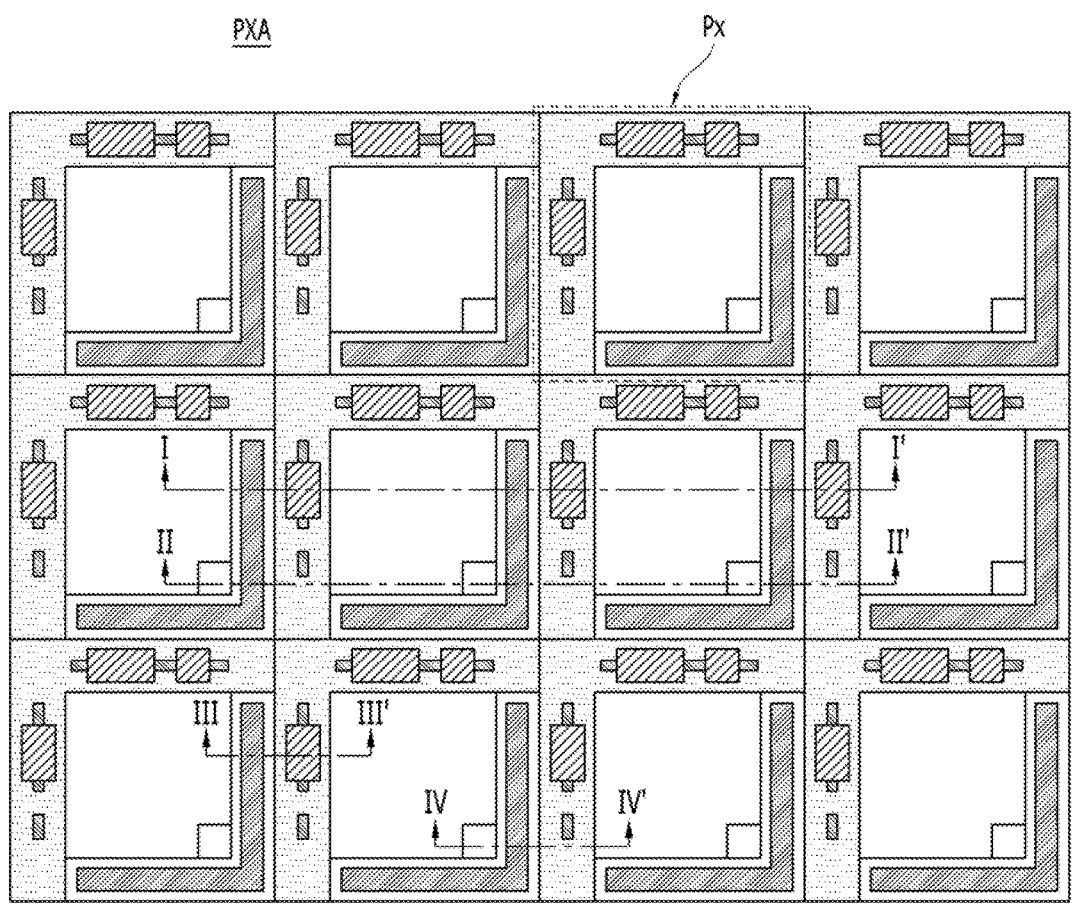
FIG. 2A is a layout of a pixel array of the image sensor in accordance with the embodiment of the present invention.

FIG. 2A is a layout of a pixel array PXA of the image sensor in accordance with the embodiment of the present invention. FIG. 25 is a layout of a unit pixel Px of the pixel array PXA in accordance with the embodiment of the present invention.

Figure 2B:
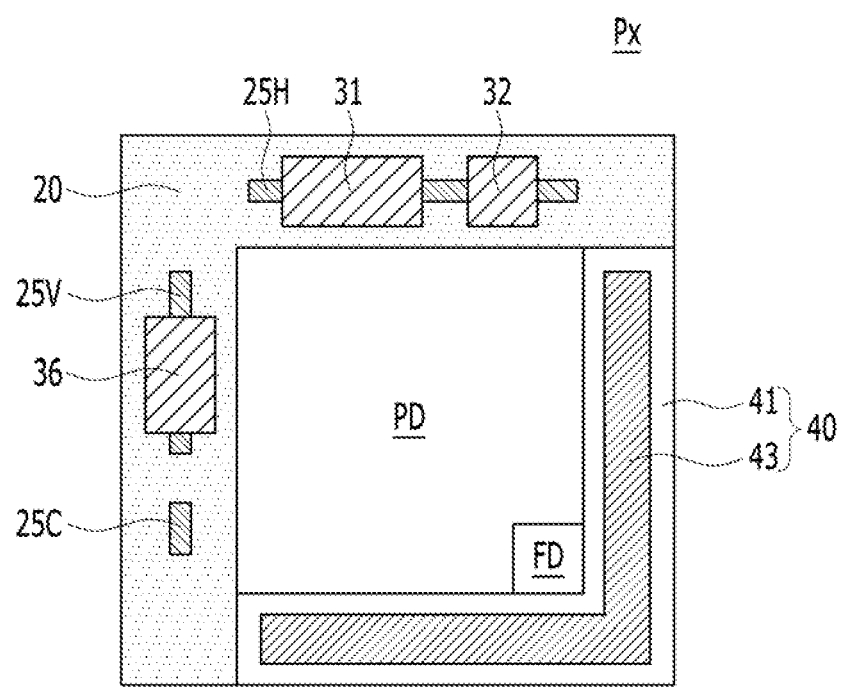
FIG. 2B is a layout of a unit pixel of the pixel array in accordance with the embodiment of the present invention.

Referring to FIGS. 2A and 2B, the pixel array PXA of the image sensor may include a plurality of unit pixels Px that are 2-dimensionally arranged in a matrix form. Each of the unit pixels Px may include a photodiode PD, a floating diffusion region FD, a Shallow Trench Isolation (STI) region 20 and a transfer gate 40 (See FIG. 2B).

The unit pixel Px may further include a horizontal active region 25H, a vertical active region 25V, and a contact active region 25C that are defined by the STI region 20. The unit pixel Px may further include a first horizontal gate electrode 31 and a second horizontal gate electrode 32 vertically overlapped with the horizontal active region 25H, and a vertical gate electrode 36 vertically overlapped with the vertical active region 25V.

The photodiode PD may include a P-type region and an N-type region that are formed in a single-crystalline silicon wafer or an epitaxially grown single-crystalline silicon layer. The P-type region may include a P-type impurity such as boron (B), and the N-type region may include an N-type impurity such as phosphorous (P) and/or arsenic (As). The photodiode PD may have a rectangle shape or a substantially rectangle shape in top view. However, the invention may not be limited in this way.

As illustrated in FIG. 2B, the floating diffusion region FD may be disposed over one of the corners of the photodiode PD so that the floating diffusion region FD may be vertically overlapped with a portion of the photodiode PD. The floating diffusion region FD may include an N-type impurity such as phosphorous (P) and/or arsenic (As).

As illustrated in FIG. 2B, the STI region 20 may be disposed over the photodiode PD so that the STI region 20 is disposed to be adjacent to at least two sides of the photodiode PD. In another embodiment, not shown the STI region 20 may be disposed to be vertically overlapped with a portion of the photodiode PD. For example, the STI region 20 may have an elbow shape to be vertically overlapped with a region adjacent to the upper side of the photodiode PD and a region adjacent to the left side of the photodiode PD. Referring again to FIG. 2B, the STI region 20 may include a horizontal portion that includes the horizontal active region 25H and a vertical portion that includes the vertical active region 25V and the contact active region 25C. The first horizontal gate electrode 31 and the second horizontal gate electrode 32 may be overlapped with a portion of the horizontal active region 25H. For example, the first horizontal gate electrode 31 may provide a gate electrode of a drive transistor, and the second horizontal gate electrode 32 may provide a gate electrode of a select transistor. Therefore, the horizontal active region 25H may provide source regions, drain regions, and channel regions of a drive transistor and a select transistor.

The vertical gate electrode 36 may be overlapped with a portion of the vertical active region 25V. For example, the vertical gate electrode 36 may provide a gate electrode of a reset transistor. Thus, the vertical active region 25V may provide a source region, a drain region, and a channel region of the vertical gate electrode 36. A contact plug may be disposed over the contact active region 25C to apply a voltage to well regions of transistors. Also, contact plugs may be disposed over the horizontal active region 25H and the vertical active region 25V.

The transfer gate 40 may have an elbow shape that is adjacent to at least two sides of the photodiode PD. The transfer gate 40 may be positioned around the corner of the photodiode PD over which the floating diffusion FD is positioned. For example, in the illustrated embodiment of FIG. 2B, the transfer gate 40 may be disposed to abut onto the lower side and the right side of the photodiode PD while not vertically overlapped with the photodiode PD. Hence, the transfer gate 40 together with the STI region 20 may form a square shape that surrounds the perimeter of the photodiode PD. The STI region 20 may vertically overlap the perimeter of the photodiode PD. In an alternative embodiment (not shown), the transfer gate 40 together with the STI region 20 may form a square shape that may overlap with an area of the photodiode along the perimeter of the photodiode PD. Referring now again to FIG. 2B, the transfer gate 40 may include a transfer gate insulating layer 41 and a transfer gate electrode 43. The transfer gate insulating layer 41 may enclose the internal surface and external surface of the transfer gate electrode 43. Accordingly, the transfer gate insulating layer 41 may be interposed between the photodiode PD and the transfer gate electrode 43 and between the floating diffusion region FD and the transfer gate electrode 43.

Figure 3A:
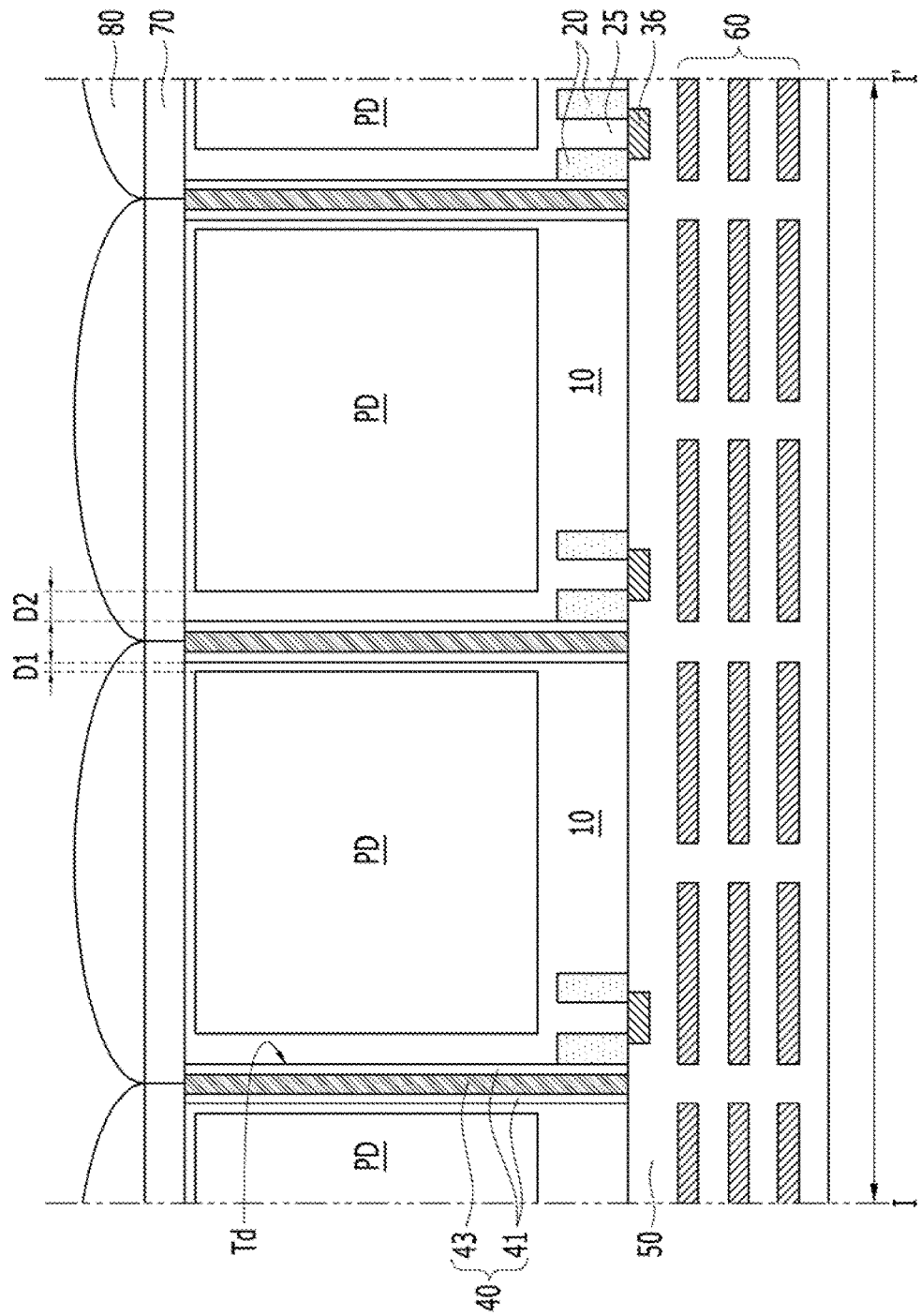
FIGS. 3A to 3B are longitudinal cross-sectional views obtained by cutting the pixels of the image sensor shown in FIG. 2A along an I-I' line and a II-II' line, respectively, in accordance with the embodiment of the present invention.
Figure 3B:
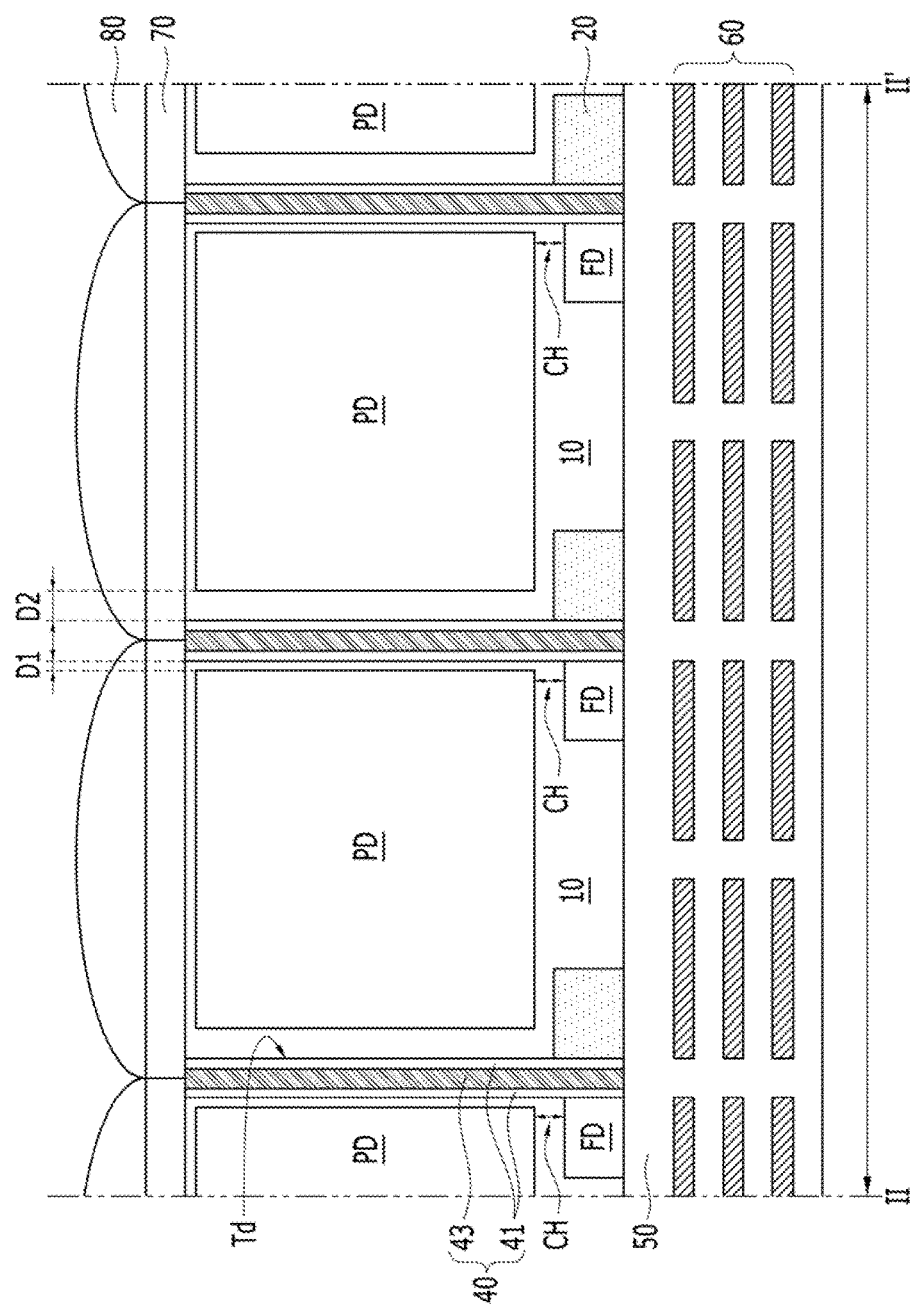

FIGS. 3A to 3B are longitudinal cross-sectional views obtained by cutting the pixels Px of the image sensor shown in FIG. 2A along an I-I' line and a II-II' line, respectively, in accordance with the embodiment of the present invention.

Referring to FIGS. 3A to 3B, the pixels Px of the image sensor may include photodiodes PD formed in a substrate 10, STI regions 20, floating diffusion regions FD, transfer gates 40, gate electrodes 36 that are formed under a lower surface of the substrate 10, an inter-layer dielectric layer 50, metal lines 60, color filters 70 and micro lenses 80 that are formed over an upper surface of the substrate 10.

The transfer gates 40 may include transfer gate insulating layers 41 that are conformally formed over the sidewalls of deep trenches Td formed between the photodiodes PD and transfer gate electrodes 43 that are surrounded by the transfer gate insulating layers 41 to fill the deep trenches Td. The deep trenches Td may be formed to surround the outer sides of the photodiodes PD. The deep trenches Td may have a greater depth than the height of the planar surfaces of the photodiodes PD. In other words, the deep trenches Td may vertically pass through the substrate 10 completely to reach the interlayer dielectric layer 50. The transfer gate insulating layers 41 may include oxidized silicon that is formed as the planar surfaces of the substrate 10 exposed inside the deep trenches Td are oxidized The transfer gate electrodes 43 may include a conductor such as a doped polysilicon. The transfer gates 40 may provide vertical channels CH between the photodiodes PD and the floating diffusion regions FD. The distance D1 between a transfer gate 40 and the photodiode PD for which the transfer gate 40 provides the channel CH is shorter than the distance D2 between the transfer gate 40 and the photodiode PD of another pixel that is adjacent to the transfer gate 40.

The STI regions 20 are disposed adjacent to first sides of the transfer gates 40 of another pixel. The STI regions 20 may define active regions 25 and may prevent the channels CH from being extended. For example, when the transfer gates 40 of a first pixel are activated, the STI regions 20 may prevent the channels CH being formed in a second pixel so that the changes inside the photodiodes PD of the second pixel that is disposed adjacent to the first pixel are not affected.

The gate electrodes 36 may be formed over the STI regions 20 and the active regions 25 For example, although the gate electrodes 36 are illustrated as reset gate electrodes the gate electrodes 36 may be understood as drive gate electrodes or reset gate electrodes.

Figure 4A:
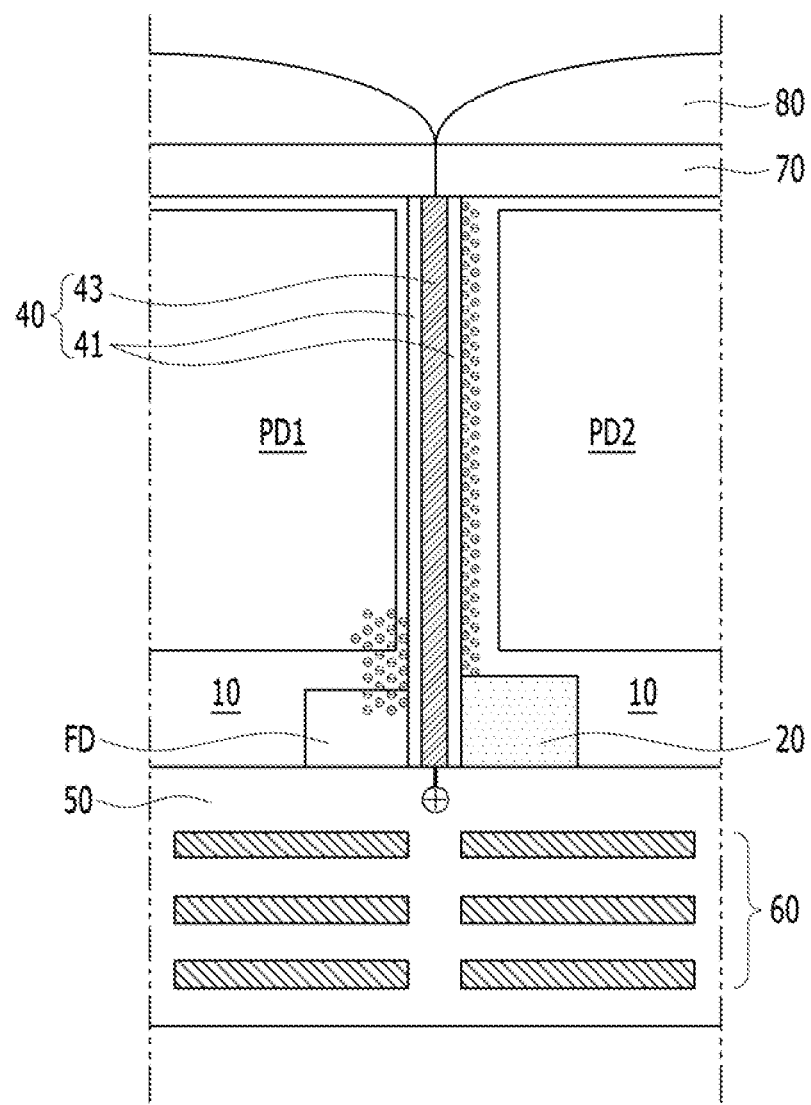
FIGS. 4A to 4B conceptually illustrate the states of electrons and holes when a positive voltage and a negative voltage are applied to a transfer gate electrode, respectively, in accordance with the embodiment of the present invention.
Figure 4B:
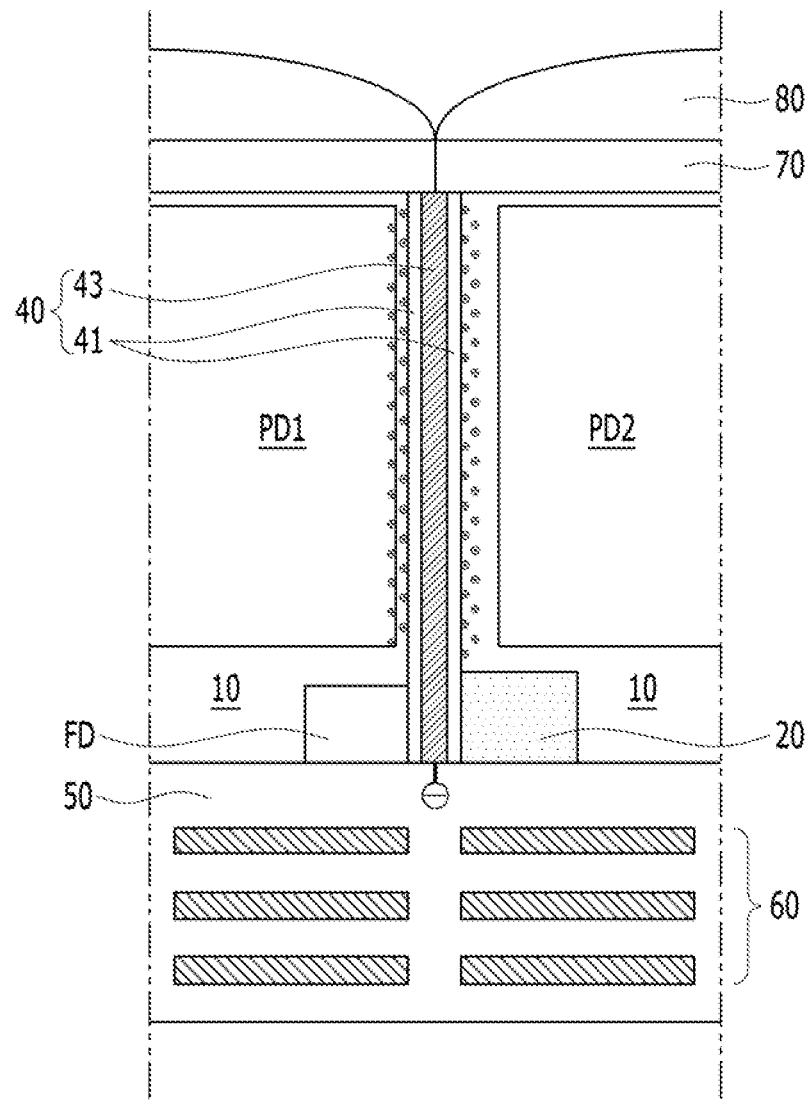

FIGS. 4A to 4B schematically illustrate the states of photoelectrons and holes when a positive voltage (+) and a negative voltage (−) are applied to a transfer gate electrode 43, respectively, in accordance with an embodiment of the present invention. Referring to FIG. 4A, when a positive voltage (+) is applied to the transfer gate electrode 43, the photoelectrons inside a first photodiode PD1 of a first pixel may transfer in the vicinity of a corresponding floating diffusion region FD inside the first pixel. However, photoelectrons inside a second photodiode PD2 of a second pixel that is disposed adjacent to the first pixel may be accumulated onto the sidewall of the photodiode PD2. The transfer of the photoelectrons inside the photodiode PD2 of the second pixel may be restricted by an STI region 20. Referring to FIG. 4B, when a negative voltage (−) is applied to the transfer gate electrode 43, the photoelectrons inside the photodiode PD1 of the first pixel and the photodiode PD2 of the second pixel may be accumulated onto the sidewalls that are close to the transfer gate electrode 43.

Figure 5B:
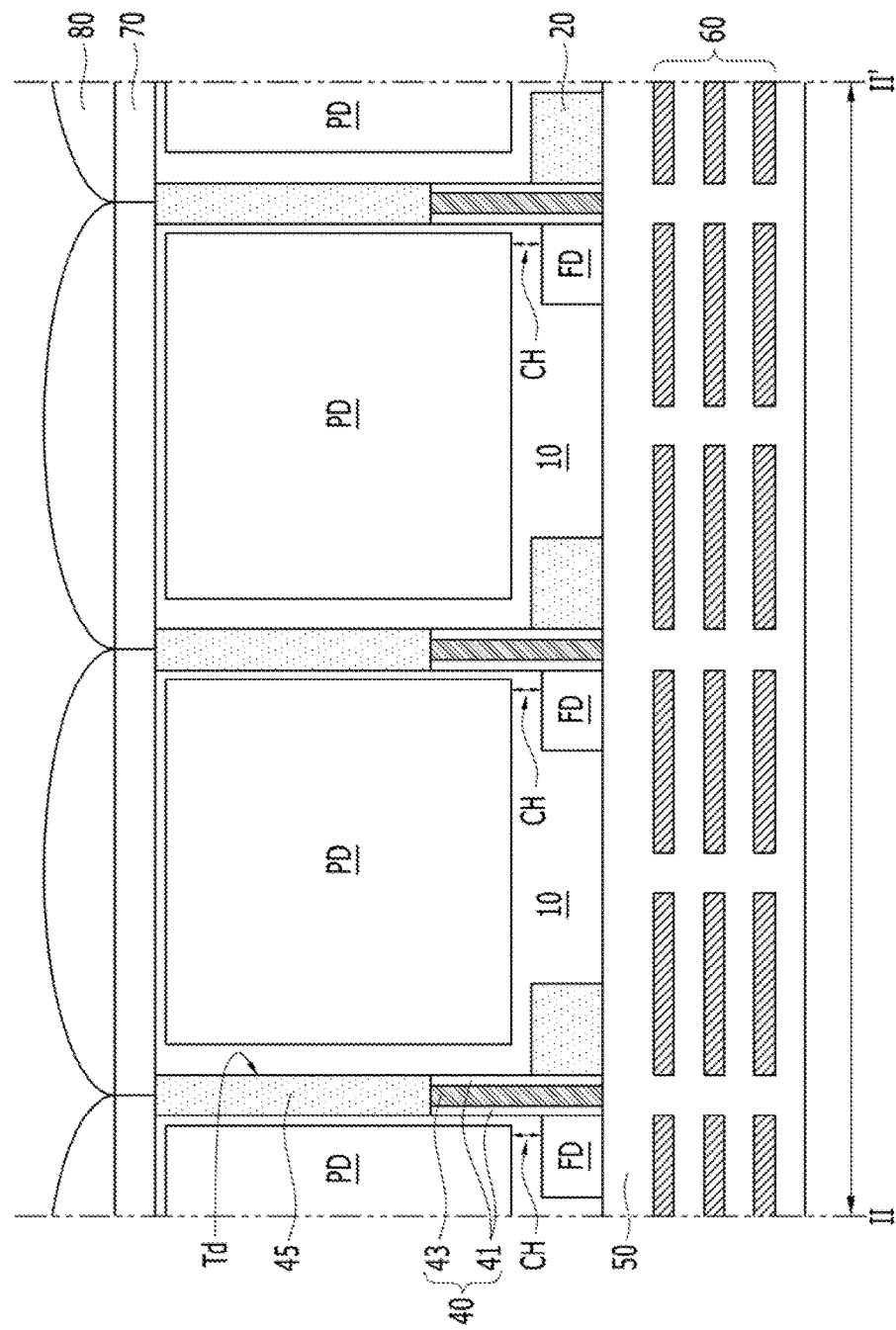

FIGS. 5A and 5B are longitudinal cross-sectional views illustrating pixels of an image sensor in accordance with an embodiment of the present invention. Referring to FIGS. 5A and 5B, the pixels of the image sensor may include a gap-fill insulator 45 filling a portion of each of the deep trenches Td and transfer gates 40 each of which is formed in a portion of each deep trench Td, compared with the pixels of the image sensor described above with reference to FIGS. 3A and 3B. Specifically, the portions of the deep trenches Td near to the color filters 70 are filled with the gap-fill insulator 45, and the portions of the deep trenches Td near to the floating diffusion regions FD are occupied by the transfer gates 40.

Since the transfer gates 40 are formed in the deep trenches Td, the transfer gates 40 do not occupy any horizontal area. Since the photodiodes PD and the floating diffusion regions FD overlap with each other vertically, the photodiodes PD may occupy wide horizontal area. Accordingly, it is possible to broaden the light reception area of the image sensor. As a result, the image sensor may have improved light sensing capability.

According to the embodiments of the present invention, since the two sides of the photodiodes PD and the floating diffusion regions FD may be used as channel regions, the width of the channels CH may be widened. Therefore, the driving capability of the transfer gates 40 is improved.

According to the embodiments of the present invention, when a negative (−) voltage is applied to the transfer gate electrodes 43 in an idle mode, holes may be accumulated between the transfer gate electrodes 43 and the floating diffusion regions FD. Therefore, dark current may be reduced or prevented.

FIGS. 6A to 6G are longitudinal cross-sectional views describing a method for forming an image sensor in accordance with an embodiment of the present invention. The cross-sectional views are taken by cutting the pixel array of FIG. 2A along a III-III' line and a IV-IV' line.

Figure 6A:
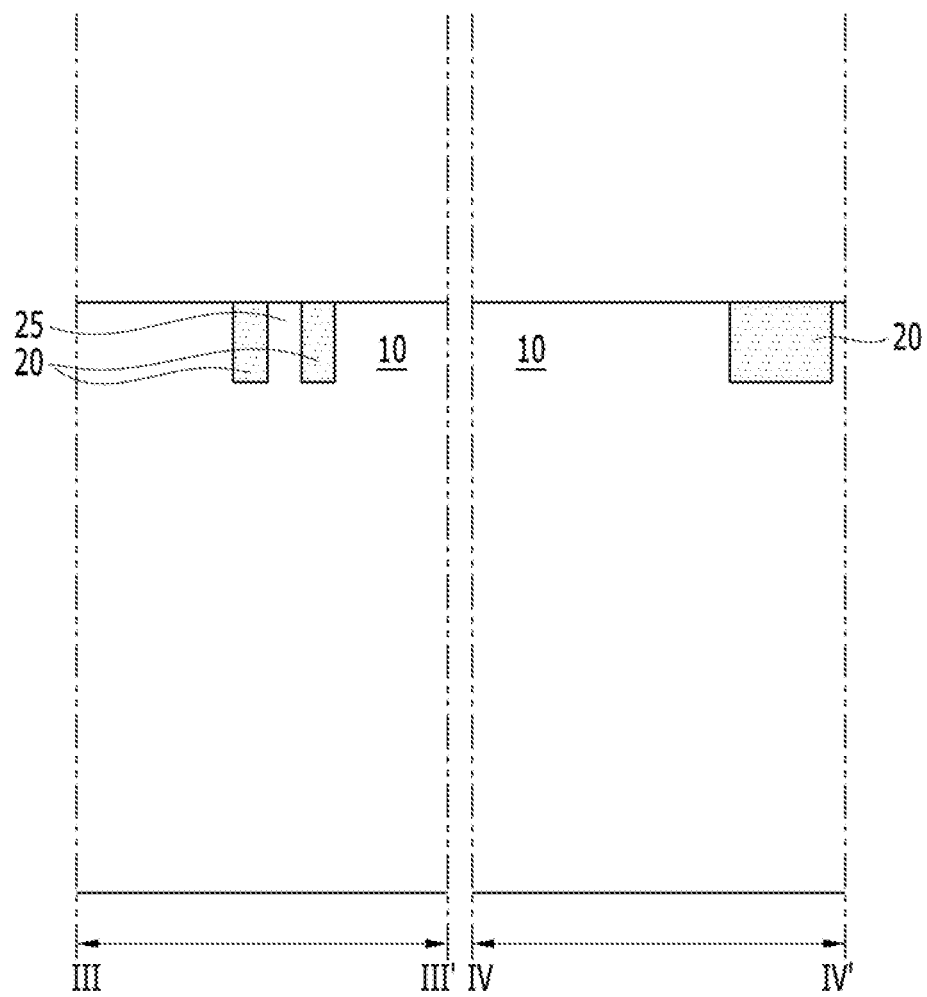
FIGS. 6A to 6G are longitudinal cross-sectional views describing a method for forming an image sensor in accordance with an embodiment of the present invention.

Referring to FIG. 6A, the method for forming an image sensor may include forming STI regions 20 that define active regions 25 in a substrate 10. The STI regions 20 may be formed by forming shallow trenches in the substrate 10 through a Shallow Trench Isolation (STI) forming process and filling the shallow trenches with a trench isolation material such as a silicon oxide or a silicon nitride. The substrate 10 may include a single crystalline silicon wafer or an epitaxially grown single-crystalline silicon layer.

Figure 6B:
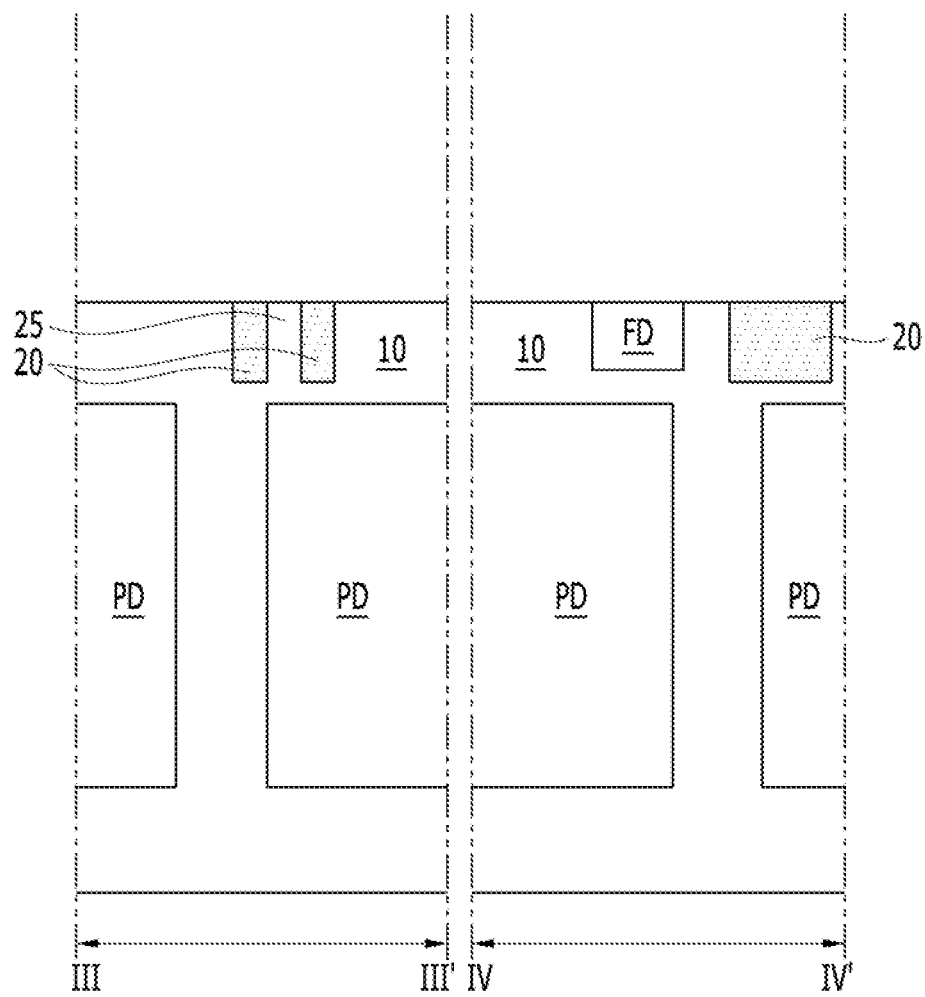

Referring to FIG. 6B, the method may include forming photodiodes PD and floating diffusion regions FD in the substrate 10. The photodiodes PD may be formed by implanting a P-type impurity such as boron (8) into the substrate 10 and implanting an N-type impurity such as phosphorous (P) or arsenic (As) into the substrate 10. The floating diffusion regions FD may be formed by implanting an N-type impurity such as phosphorous (P) or arsenic (As) into the substrate 10.

Figure 6C:
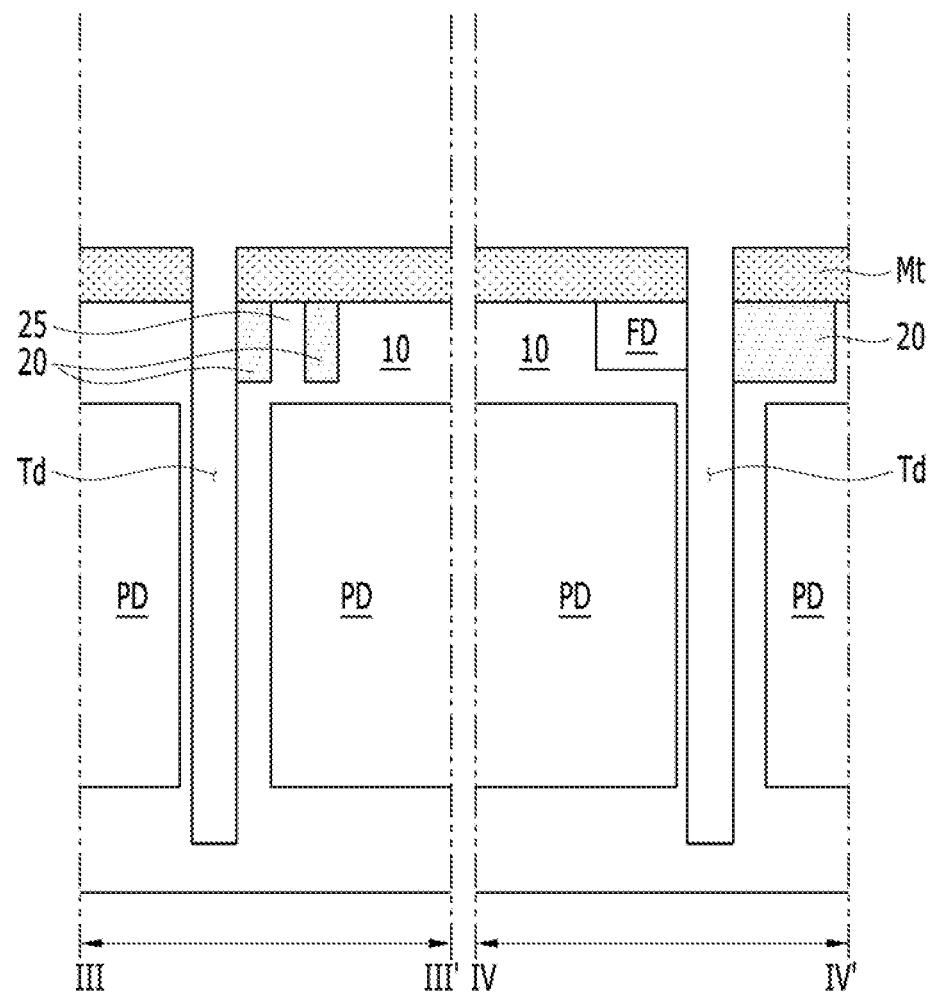

Referring to FIG. 6C, the method may include forming deep trenches Td between the photodiodes PD by forming a trench mask Mt over the substrate 10 and performing an etch process with the trench mask Mt used as an etch mask. The trench mask Mt may include a hard mask which includes at least one among silicon nitrides, silicon oxides, and combinations thereof. Referring back to FIGS. 2A and 2B, the deep trenches Td may have an elbow shape which is adjacent to two sides of the photodiodes PD in a top view. Each of the deep trenches Td may be disposed not in the same distance from the photodiodes PD on both sides of the deep trench Td, but each of the deep trenches Td may be disposed to be one-sided near to one photodiode PD. For example, the deep trenches Td may be disposed relatively near to the left photodiodes PD and relatively far from the right photodiodes PD. The deep trenches Td may be formed to be higher than the height of the photodiodes PD.

Figure 6D:
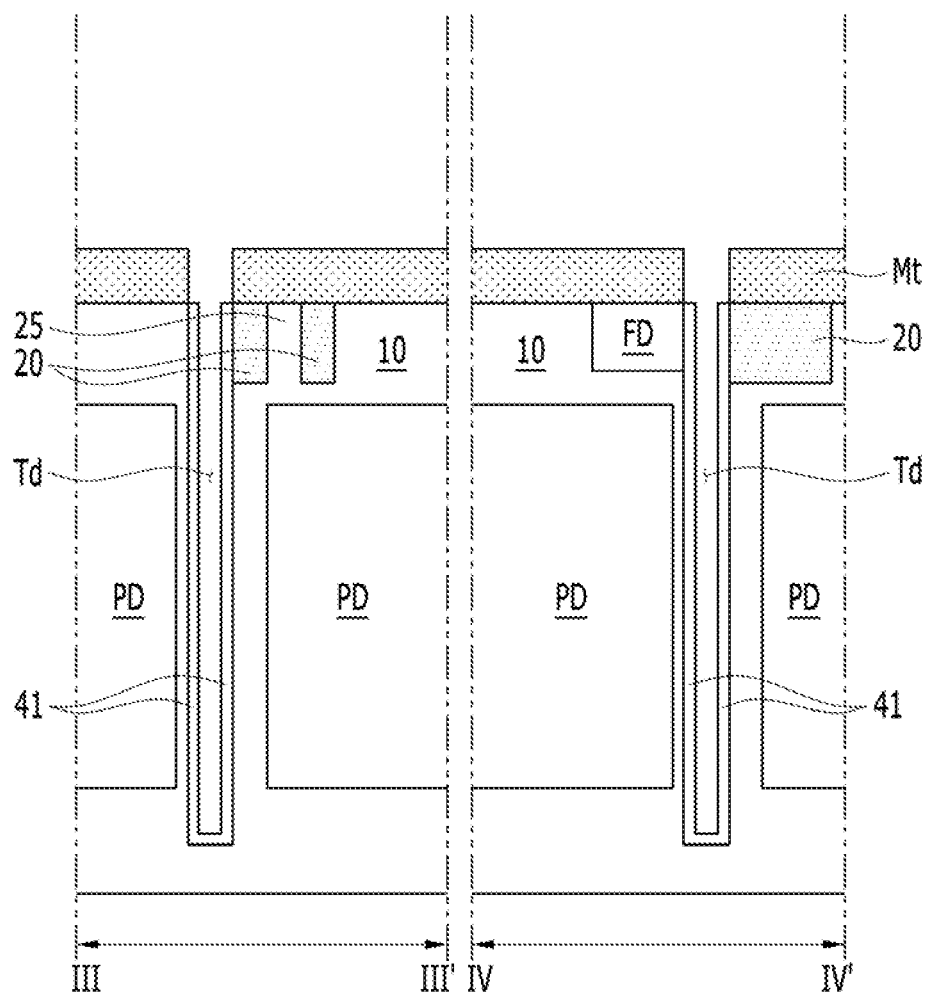

Referring to FIG. 6D, the method may include forming an oxidized silicon layer as transfer gate insulating layers 41 on the exposed sidewalls and bottom surfaces of the deep trenches Td by performing an oxidation process. In an embodiment, the oxidation process may include a thermal radical oxidation process. In another embodiment, the oxidation process may include a plasma radical oxidation process. Subsequently, the trench mask Mt may be removed.

Figure 6E:
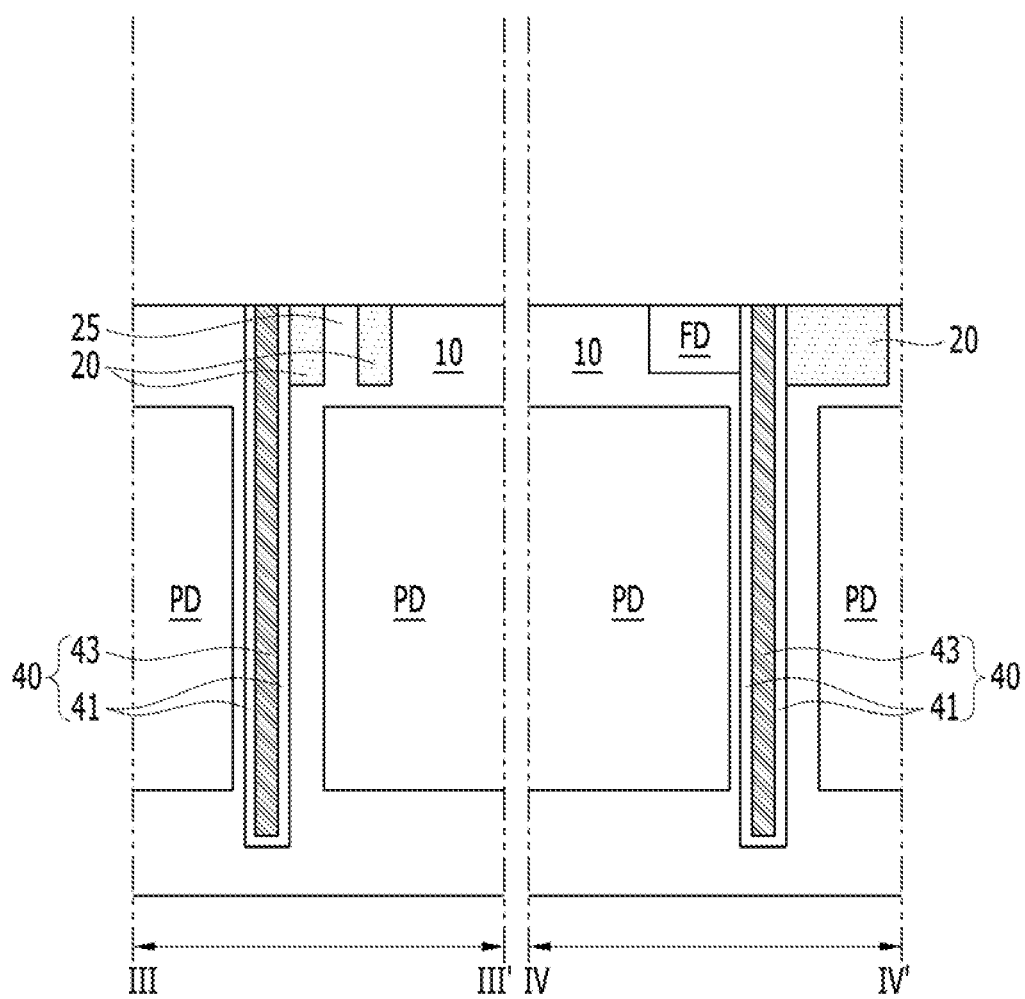

Referring to FIG. 6E, the method may include forming transfer gates 40 including transfer gate insulating layers 41 and transfer gate electrodes 43 by forming a gate electrode material layer over the oxidized silicon layer of the deep trenches Td through a deposition process and performing a planarization process, such as a Chemical Mechanical Polishing (CMP) process to remove any gate electrode material over the deep trenches. The gate electrode material layer may be formed, for example, by depositing a doped polysilicon into the deep trenches Td.

Figure 6F:
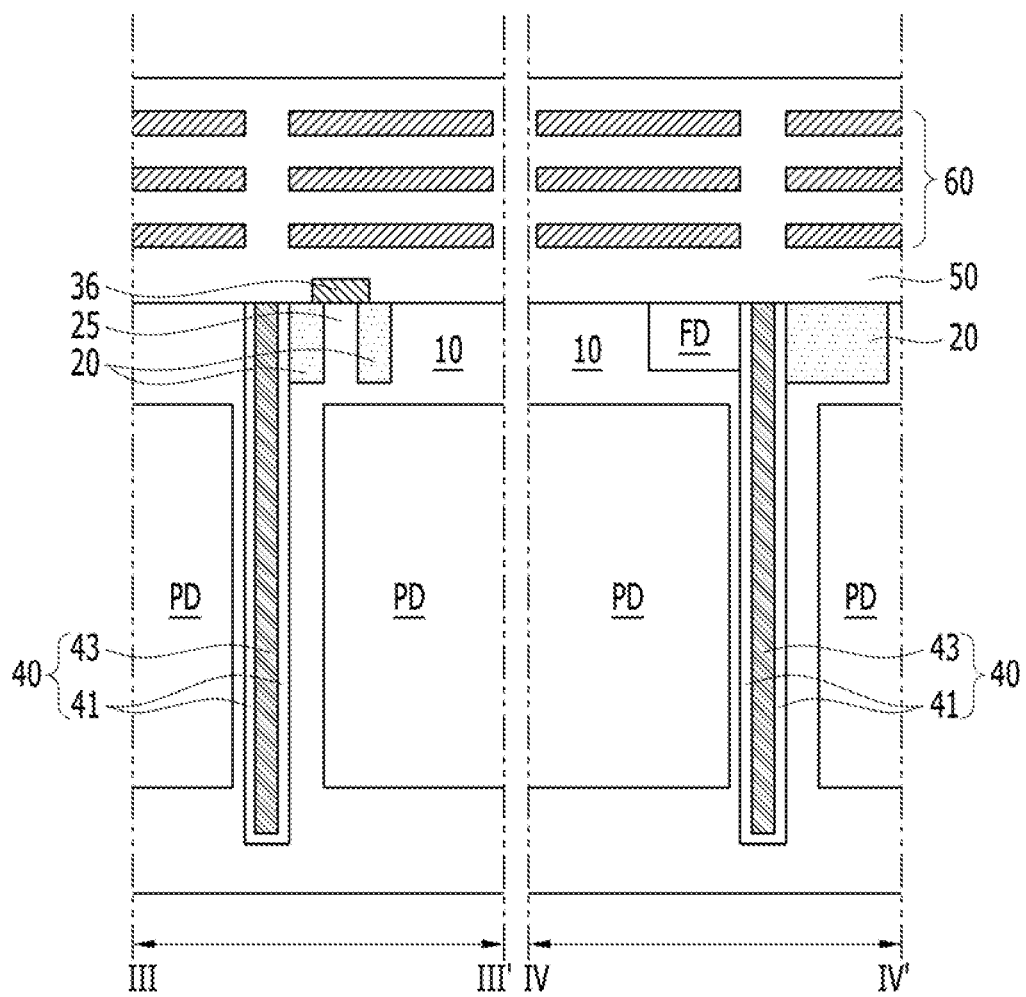

Referring to FIG. 6F, the method may include forming pixel gate electrodes 36 over the active regions 25 and forming an inter-layer dielectric layer 50 and multiple layers of metal lines 60. The pixel gate electrodes 36 may be formed by forming a gate electrode material layer through a deposition process and then patterning the gate electrode material layer through photolithography and/or etch processes. The pixel gate electrodes 36 may provide at least one selected among a reset gate electrode, a drive gate electrode, and a select gate electrode. The inter-layer dielectric layer 50 may be formed by forming a silicon oxide, such as tetraethyl-ortho-silicate (TEOS) through a deposition process. Also, the multiple layers of the metal lines 60 may be formed by repeatedly performing deposition processes, photolithography processes, and etch processes.

Figure 6G:
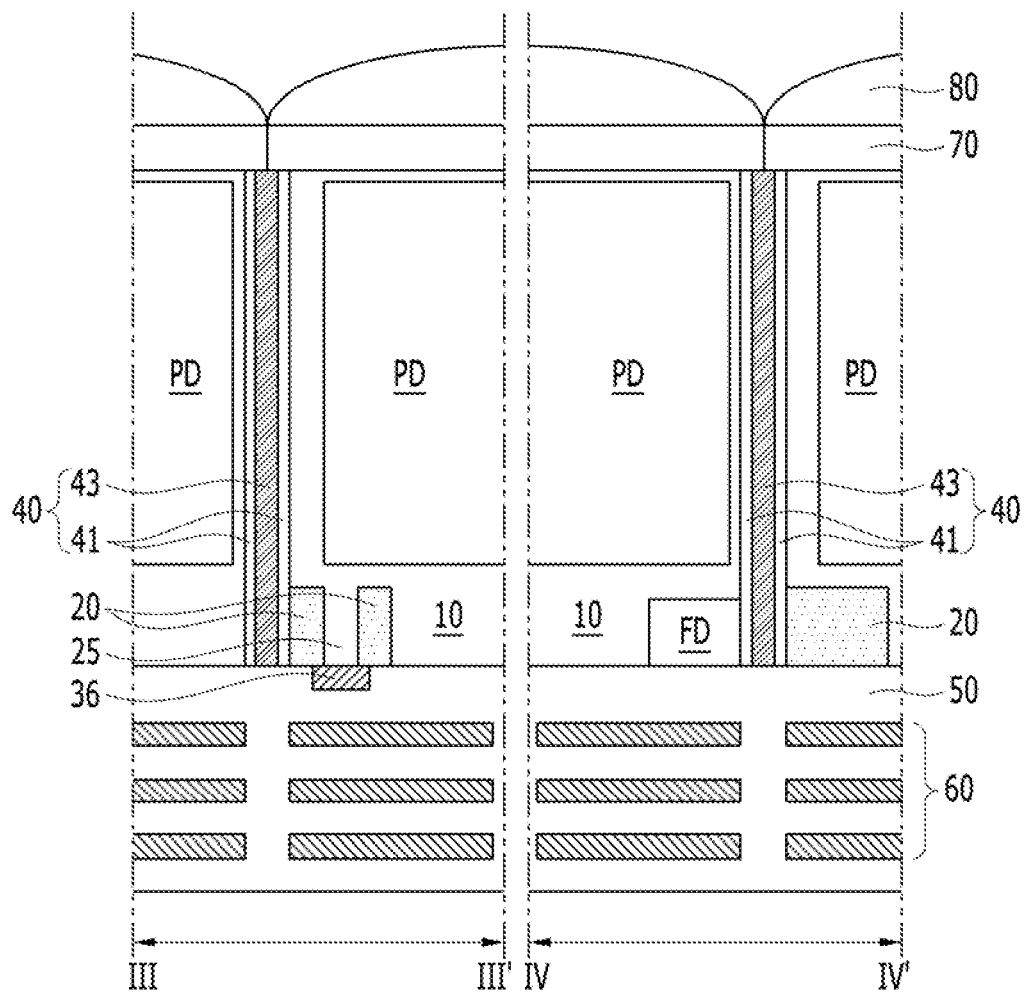

Referring to FIG. 6G, the method may include turning the substrate 10 upside down, performing a thinning process to remove a portion of the upper portion of the substrate 10 so that the transfer gates 40 are exposed, and forming color filters 70 and micro lenses 80 over the thinned substrate 10. The thinning process may include a grinding process and/or an etch-back process. The method may further include forming a planarization layer or an anti-reflection layer (not shown) including a silicon oxide or a silicon nitride in the lower portion or the upper portion of the color filters 70.

FIGS. 7A to 7H are longitudinal cross-sectional views describing a method for forming an image sensor in accordance with an embodiment of the present invention.

Figure 7A:
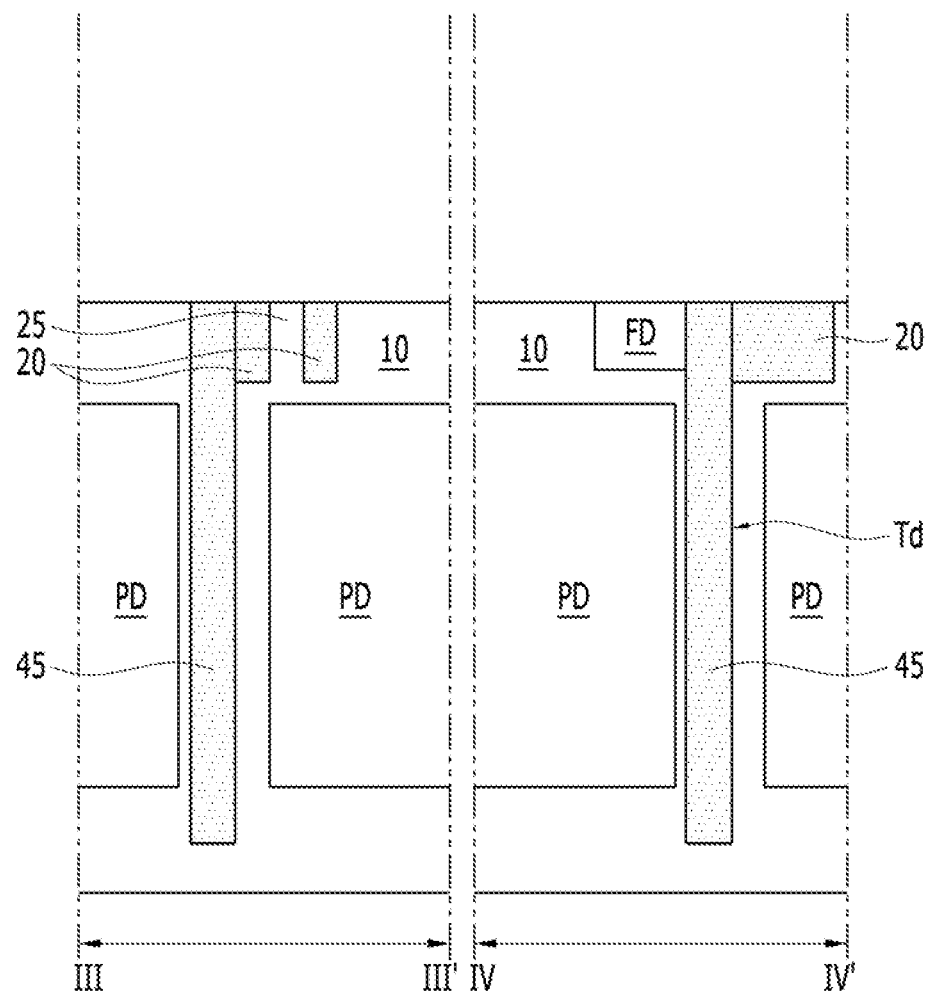
FIGS. 7A to 7E are longitudinal cross-sectional views describing a method for forming an image sensor in accordance with an embodiment of the present invention.

Referring to FIG. 7A, the method for forming an image sensor may include forming photodiodes PD and floating diffusion regions FD in a substrate 10, forming deep trenches Td and shallow trenches, and forming a gap-fill insulator 45 that are formed in the deep trenches Td and STI regions 20 that are formed in the shallow trenches. The gap-fill insulator 45 and the STI regions 20 may include a silicon oxide. The STI regions 20 may define active regions 25.

Figure 7B:
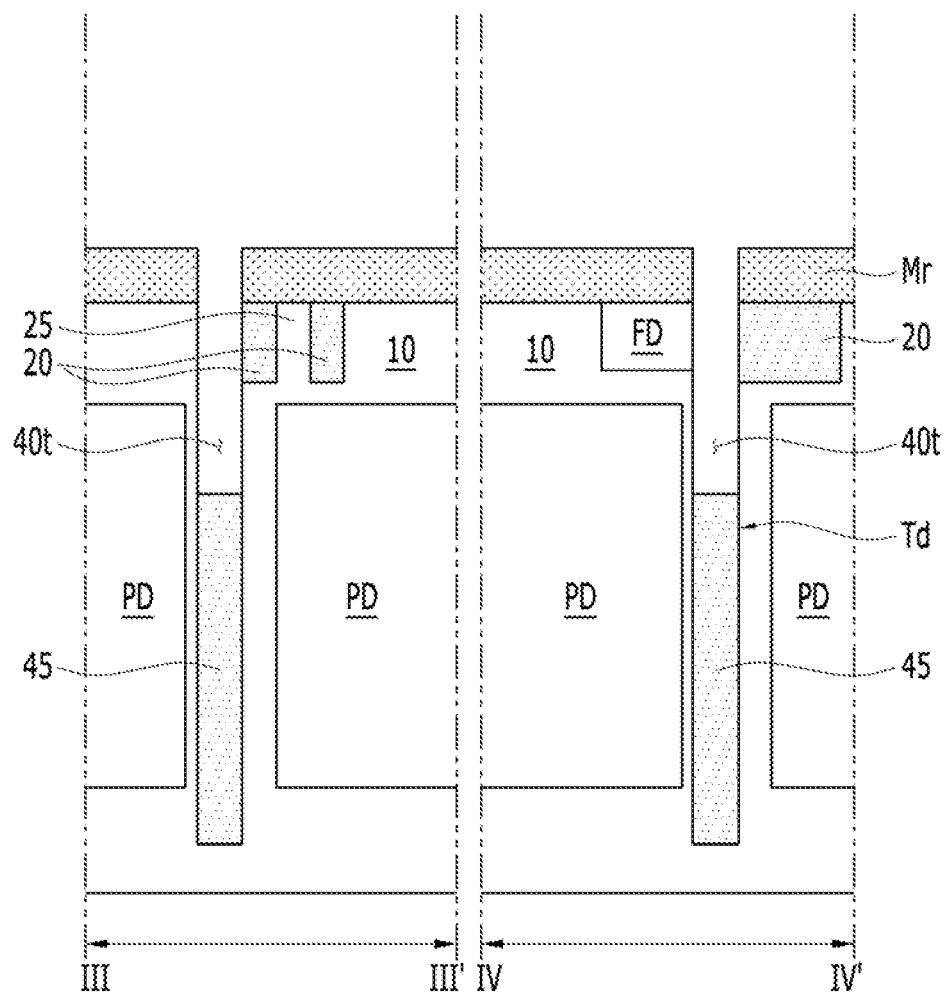

Referring to FIG. 7B, the method may include forming a recess mask Mr, and forming gate trenches 40*t* by performing a recess process or an etch process and thereby recessing the upper surface of the gap-rill insulator 45 inside the deep trenches Td. Subsequently, the recess mask Mr may be removed.

Figure 7C:
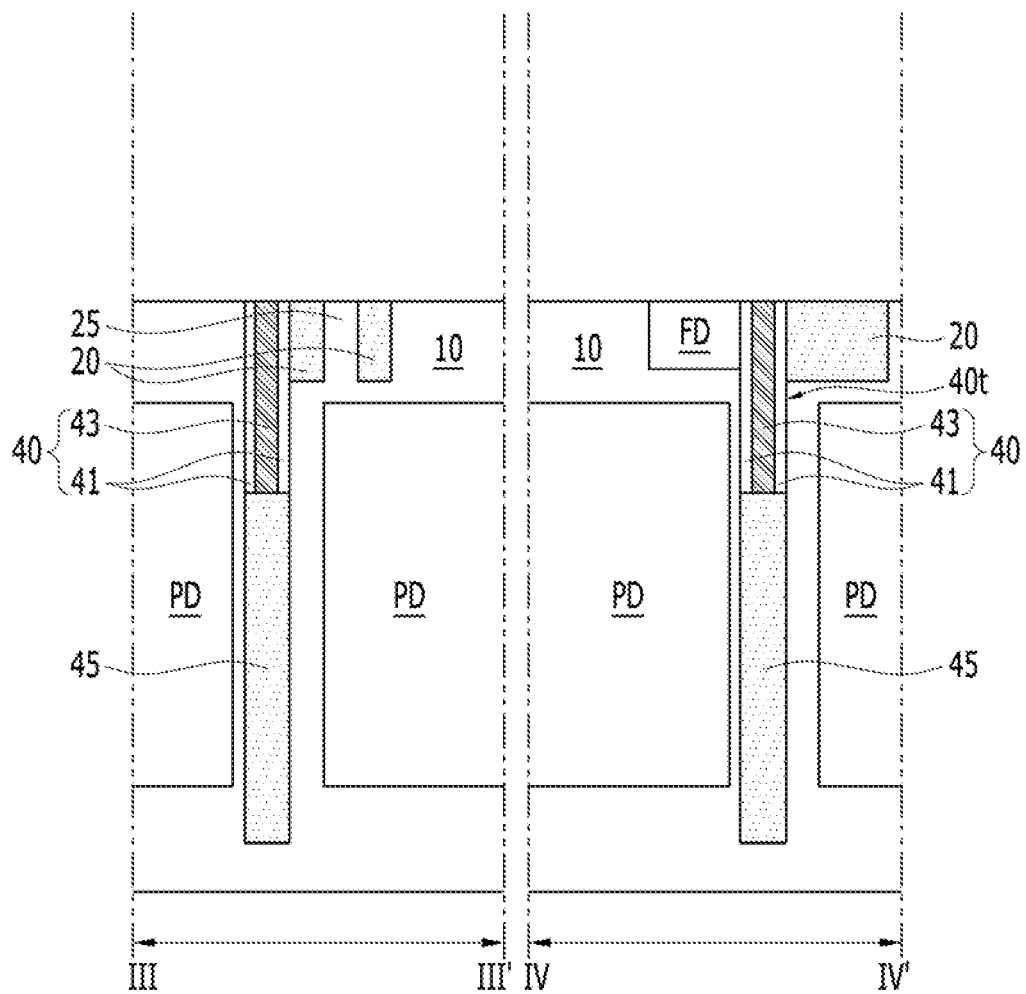

Referring to FIG. 7C, the method may include forming a dielectric layer including an oxidized silicon on the internal walls of the gate trenches 40*t*, forming an electrode material layer that fills the gate trenches 40*t* over the dielectric layer, and forming transfer gates 40 including transfer gate insulating layers 41 and a transfer gate electrode 43 by performing a CMP process.

Figure 7D:
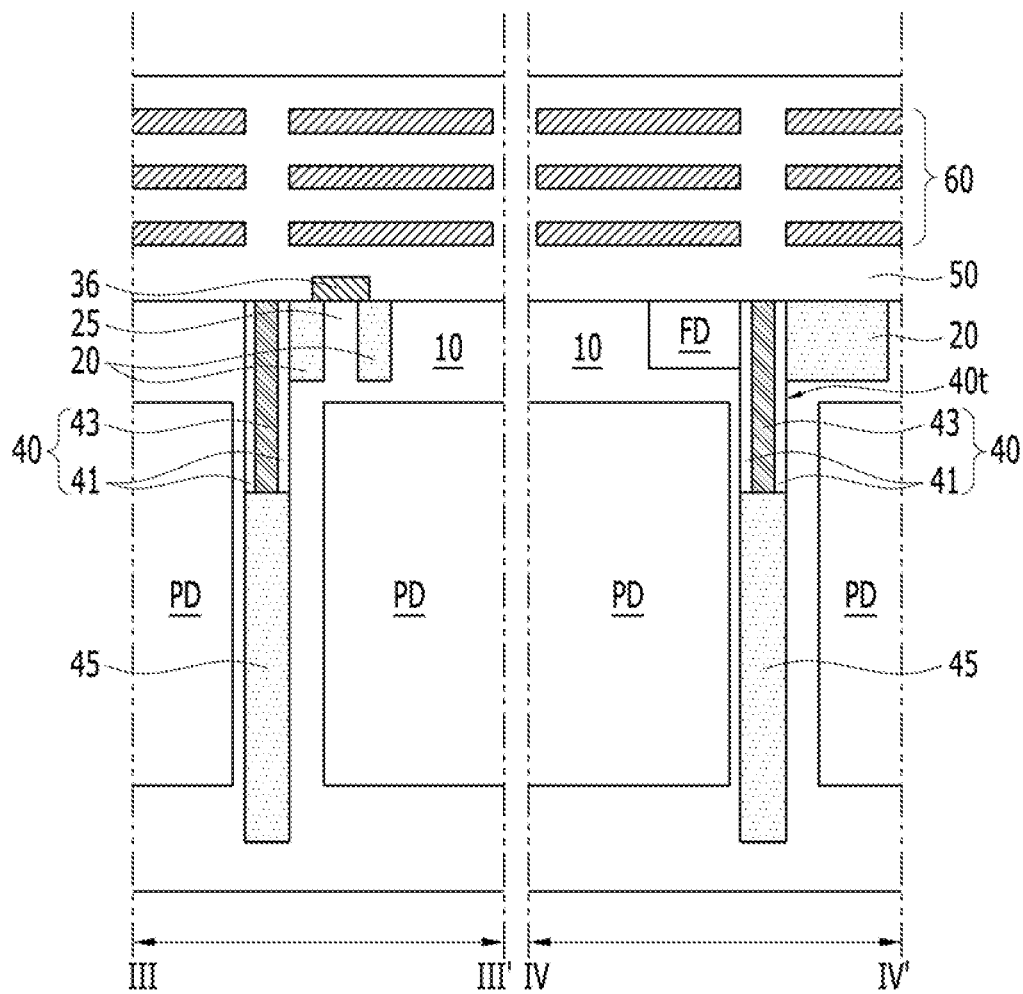

Referring to FIG. 7D, the method may include forming pixel gate electrodes 36 over the active regions 25, and forming an inter-layer dielectric layer 50 and multiple layers of metal lines 60.

Figure 7E:
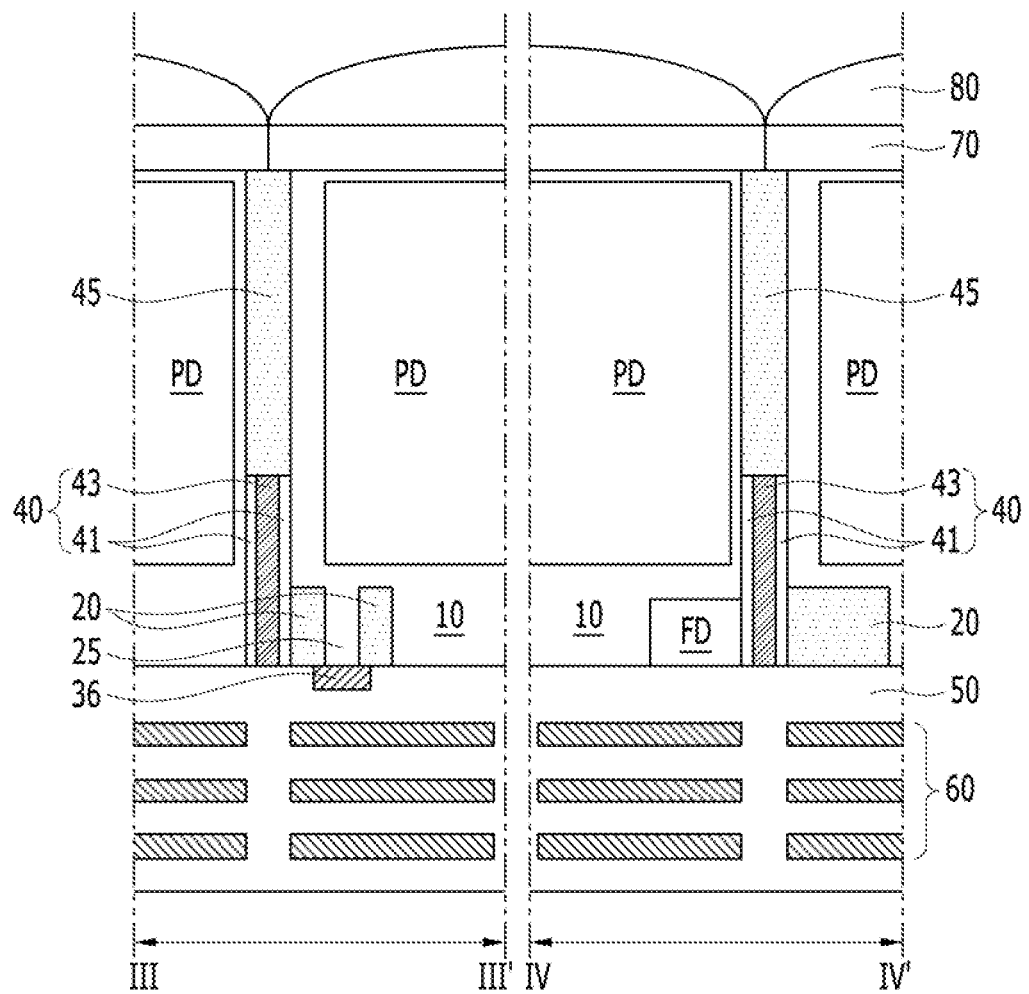

Referring to FIG. 7E, the method may include turning the substrate 10 upside down, performing a thinning process to remove a portion of the upper portion of the substrate 10 so that the gap-fill insulator 45 is exposed, and forming color filters 70 and micro lenses 80 over the thinned substrate 10.

Figure 8:
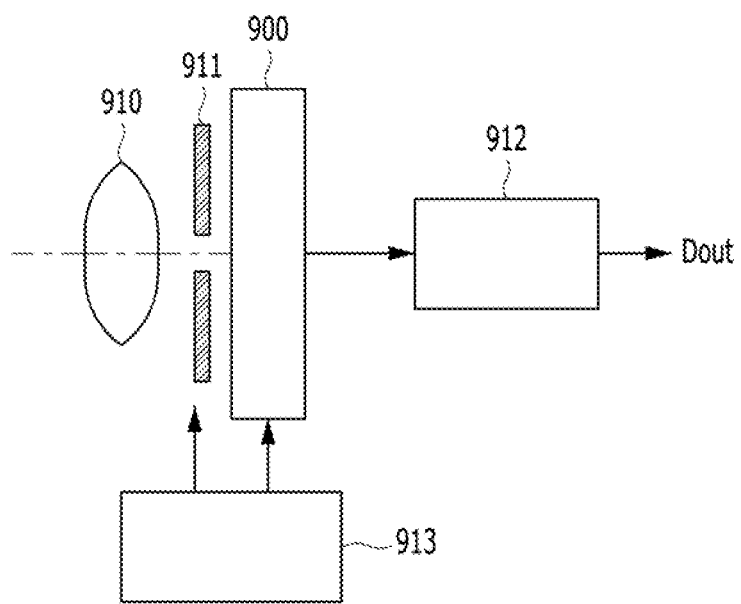
FIG. 8 is a diagram illustrating an electronic device including at least one image sensor among image sensors provided with pixels in accordance with diverse embodiments of the present invention.

FIG. 8 is a diagram illustrating an electronic device including at least one image sensor among image sensors provided with pixels in accordance with diverse embodiments of the present invention.

Referring to FIG. 8, the electronic device including at least one image sensor among image sensors provided with the pixels in accordance with diverse embodiments of the present invention may include a camera that may take a still image or a moving picture. The electronic device may include an image sensor 900, an optical system (or an optical lens) 910, a shutter unit 911, a driving unit 913 for controlling and driving the image sensor 900 and the shutter unit 911, and a signal processing unit 912.

The optical system 910 may guide image light, which is incident light, from a subject to a pixel array (refer to a reference numeral '100' of FIG. 1) of the image sensor 900. The optical system 910 may include a plurality of optical lenses. The shutter unit 911 controls for how long the image sensor 900 is to be exposed to the incident light and for how lore the image sensor 900 is to be shut off any incident light. The driving unit 913 controls a transfer operation of the image sensor 900 and a shutting operation of the shutter unit 911. The signal processing unit 912 may perform diverse signal processings with respect to the signals outputted from the image sensor 900. Image signals Dout after the signal processings are stored in a storage medium (not shown) such as a memory, or outputted to a monitor (not shown).

According to various embodiments of the present invention, an image sensor may have a wide light reception area. The image sensor includes transfer gates that do not vertically overlap with photodiodes so that the image sensor may provide vertical channels.

According to various embodiments of the present invention, an image sensor is provided having a wide channel width for improved driving capability of transfer transistors. The image sensor may include elbow-shaped transfer gates.

According to various embodiments of the present invention, an to image sensor is provided having a reduced dark current because the image sensor may have holes accumulated in an idle mode.

Other effects of diverse embodiments of the present invention that are not described herein may be understood from the detailed description of the present specification.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a photodiode formed in a substrate;
   a floating diffusion region that vertically overlaps with a first portion of the photodiode;
   a shallow trench isolation (STI) region that vertically overlaps with a second portion of the photodiode and has an elbow shape;
   a transfer gate that is adjacent to at least two sides of the photodiode and has an elbow shape;
   a horizontal active region and a vertical active region;
   a first horizontal gate electrode and a second horizontal gate electrode that are disposed over the horizontal active region; and
   a vertical gate electrode that is disposed over the vertical active region,
   wherein the STI region includes:
      a horizontal portion that defines the horizontal active region; and
      a vertical portion that defines the vertical active region.

2. The image sensor of claim 1, wherein the floating diffusion region is disposed over one corner of the photodiode.

3. The image sensor of claim 1, wherein the STI region vertically overlaps with a first region adjacent to a first side of the photodiode and a second region adjacent to a second side of the photodiode.

4. The image sensor of claim 3, wherein the transfer gate is disposed adjacent to a third side and a fourth side of the photodiode.

5. The image sensor of claim 4, wherein the transfer gate does not vertically overlap with the photodiode.

6. The image sensor of claim 1, wherein the transfer gate includes:
   a transfer gate insulating layer that is conformally formed on internal walls of a trench; and a gate electrode that is formed over the transfer gate insulating layer to fill the trench.

7. An image sensor, comprising:
a first photodiode and a second photodiode that are formed adjacent to each other in a substrate;
a transfer gate that is disposed between the first photodiode and the second photodiode;
a floating diffusion region that is adjacent to a first side of the transfer gate and vertically overlaps with a portion of the first photodiode;
a shallow trench isolation (STI) region that is adjacent to a second side of the transfer gate and vertically overlaps with a portion of the second photodiode;
an active region; and
a pixel gate electrode that is disposed over the active region and vertically overlaps with the portion of the second photodiode,
wherein the STI region defines the active region that vertically overlaps with the portion of the second photodiode.

8. The image sensor of claim 7, wherein the transfer gate includes:
a trench that has a longer depth than heights of the first photodiode and the second photodiode;
a transfer gate insulating layer that is conformally formed on sidewalls of the trench; and
a transfer gate electrode that is formed over the transfer gate insulating layer to fill the trench.

9. The image sensor of claim 8, wherein the trench vertically passes through the substrate completely.

10. The image sensor of claim 8, wherein the transfer gate further comprises:
a gap-fill insulator that fills a portion of the trench.

11. The image sensor of claim 7, wherein a first distance between the transfer gate and the first photodiode is shorter than a second distance between the transfer gate and the second photodiode.

12. An image sensor, comprising:
a plurality of unit pixels that are arranged in a matrix form,
wherein each of the plurality of the unit pixels includes:
a photodiode that has a substantially square shape in a top view;
a shallow trench isolation (STI) region that vertically overlaps with a first portion of the photodiode adjacent to an upper side and a left side of the photodiode;
a trench that surrounds an external side of the photodiode to be adjacent to a lower side and a right side of the photodiode;
a transfer gate that is formed in the trench;
a floating diffusion region that is disposed adjacent to the transfer gate and vertically overlaps with a portion of the photodiode;
an active region that vertically overlaps with a portion of the first portion of the photodiode, and
a pixel gate electrode that vertically overlaps with the active region,
wherein the STI region defines the active region,
wherein the pixel gate electrode provides at least one among a drive gate electrode, a select gate electrode, and a reset gate electrode.

13. The image sensor of claim 12, wherein the STI region and the transfer gate have an elbow shape in a top view, respectively.

14. The image sensor of claim 13, wherein the STI region and the transfer gate form a square shape together in a top view.

* * * * *